(12) United States Patent
Ho et al.

(10) Patent No.: US 10,069,051 B2
(45) Date of Patent: Sep. 4, 2018

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Hsin-Ying Ho, Kaohsiung (TW); Hsun-Wei Chan, Kaohsiung (TW); Lu-Ming Lai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/403,057

(22) Filed: Jan. 10, 2017

(65) Prior Publication Data

US 2017/0294564 A1    Oct. 12, 2017

Related U.S. Application Data

(60) Provisional application No. 62/319,960, filed on Apr. 8, 2016.

(51) Int. Cl.
| | | |
|---|---|---|
| H01L 33/58 | (2010.01) | |
| H01L 21/56 | (2006.01) | |
| H01L 33/56 | (2010.01) | |
| H01L 31/02 | (2006.01) | |
| H01L 31/0203 | (2014.01) | |
| H01L 31/0232 | (2014.01) | |
| H01L 31/18 | (2006.01) | |
| H01L 33/48 | (2010.01) | |
| H01L 33/62 | (2010.01) | |

(Continued)

(52) U.S. Cl.
CPC .......... *H01L 33/58* (2013.01); *H01L 25/0753* (2013.01); *H01L 31/0203* (2013.01); *H01L 31/02005* (2013.01); *H01L 31/02327* (2013.01); *H01L 31/186* (2013.01); *H01L 33/483* (2013.01); *H01L 33/56* (2013.01); *H01L 33/62* (2013.01); *H01L 25/167* (2013.01); *H01L 33/0095* (2013.01); *H01L 33/486* (2013.01); *H01L 2224/48091* (2013.01); *H01L 2224/48465* (2013.01); *H01L 2933/0033* (2013.01); *H01L 2933/0058* (2013.01); *H01L 2933/0066* (2013.01)

(58) Field of Classification Search
None
See application file for complete search history.

(56) References Cited

U.S. PATENT DOCUMENTS

| | | | | |
|---|---|---|---|---|
| 2011/0062471 A1* | 3/2011 | Bierhuizen | ........... | H01L 33/486 257/98 |
| 2017/0052277 A1* | 2/2017 | Wong | ........................ | G01V 8/12 |

* cited by examiner

*Primary Examiner* — Charles Garber
*Assistant Examiner* — Xiaoming Liu
(74) *Attorney, Agent, or Firm* — Foley & Lardner LLP; Cliff Z. Liu

(57) ABSTRACT

A semiconductor package device includes an electronic device. The electronic device includes a first carrier, a first electronic component, a second carrier, a second electronic component, an encapsulant, and a lens. The first electronic component is disposed on the first carrier. The second carrier defines an aperture and is disposed on the first carrier. The aperture is positioned over the first electronic component and exposes the first electronic component. The second electronic component is disposed on the second carrier. The encapsulant covers the second electronic component. The lens defines a cavity and is disposed on the aperture of the first carrier.

20 Claims, 12 Drawing Sheets

(51) Int. Cl.
*H01L 25/075* (2006.01)
*H01L 33/00* (2010.01)
*H01L 25/16* (2006.01)

SEMICONDUCTOR PACKAGE DEVICE AND METHOD OF MANUFACTURING THE SAME

CROSS-REFERENCE TO RELATED APPLICATION

This application claims the benefit of and priority to U.S. Provisional Application No. 62/319,960, filed Apr. 8, 2016, the content of which is incorporated herein by reference in its entirety.

BACKGROUND

1. Technical Field

The present disclosure relates to a semiconductor package device, and more particularly, to a semiconductor package device including light emitting components.

2. Description of the Related Art

Light Emitting Diodes (LEDs), or laser diodes, are widely used for many applications. A semiconductor light emitting device can include an LED chip having one or more semiconductor layers. The layers can be configured to emit coherent and/or incoherent light when energized. During manufacture, a large number of LED semiconductor dies can be produced on a semiconductor wafer. The wafer can be probed and tested to accurately identify particular color characteristics of each die, such as color temperature. Then, the wafer can be singulated to cut the wafer into a plurality of chips. The LED chips are typically packaged to provide external electrical connections, heat sinking, lenses or waveguides, environmental protection, and/or other features. Methods for making LED chip packages include processes such as die attach, wire bonding, encapsulating, testing, and others.

It can be a desirable feature to have, within a same package, different types of light emitting components, and/or different emission characteristics for light emitting components in the package. For example, there may be a desired characteristic of increased light emission intensity for a first type of component, and a desired characteristic of increased light emission efficiency for a second type of component. It is a further desirable feature for a package to be of a small size, including a small package thickness in a direction of light emission. For example, for a package planned to be used in consumer electronics (e.g., a smart phone), as the consumer electronics decreases in size or increases in functionality, a package size allowance for the light emitting components decreases.

SUMMARY

In accordance with some embodiments of the present disclosure, an electronic device includes a first carrier, a first electronic component, a second carrier, a second electronic component, an encapsulant, and a lens. The first electronic component is disposed on the first carrier. The second carrier defines an aperture and is disposed on the first carrier. The aperture is positioned over the first electronic component and exposes the first electronic component. The second electronic component is disposed on the second carrier. The encapsulant covers the second electronic component. The lens defines a cavity and is disposed on the aperture of the first carrier.

In accordance with some embodiments of the present disclosure, a semiconductor package device includes a carrier, a first chip, a first package body, a second package body and a second chip. The first chip is disposed on the carrier. The first package body encapsulates the first chip. The second package body defines a cavity and is disposed on the carrier. The second chip is disposed within the cavity of the second package body.

In accordance with some embodiments of the present disclosure, a method of manufacturing a semiconductor package device includes: (a) providing a first carrier structure defining an aperture and a first chip disposed on the first carrier; (b) forming an encapsulant covering the first chip; (c) forming a lens over the aperture, the lens defining a cavity; (d) providing a second carrier and a second chip disposed on the second carrier; and (e) connecting the first carrier to the second carrier, the second chip being positioned within the cavity of the lens.

Figure 1A:
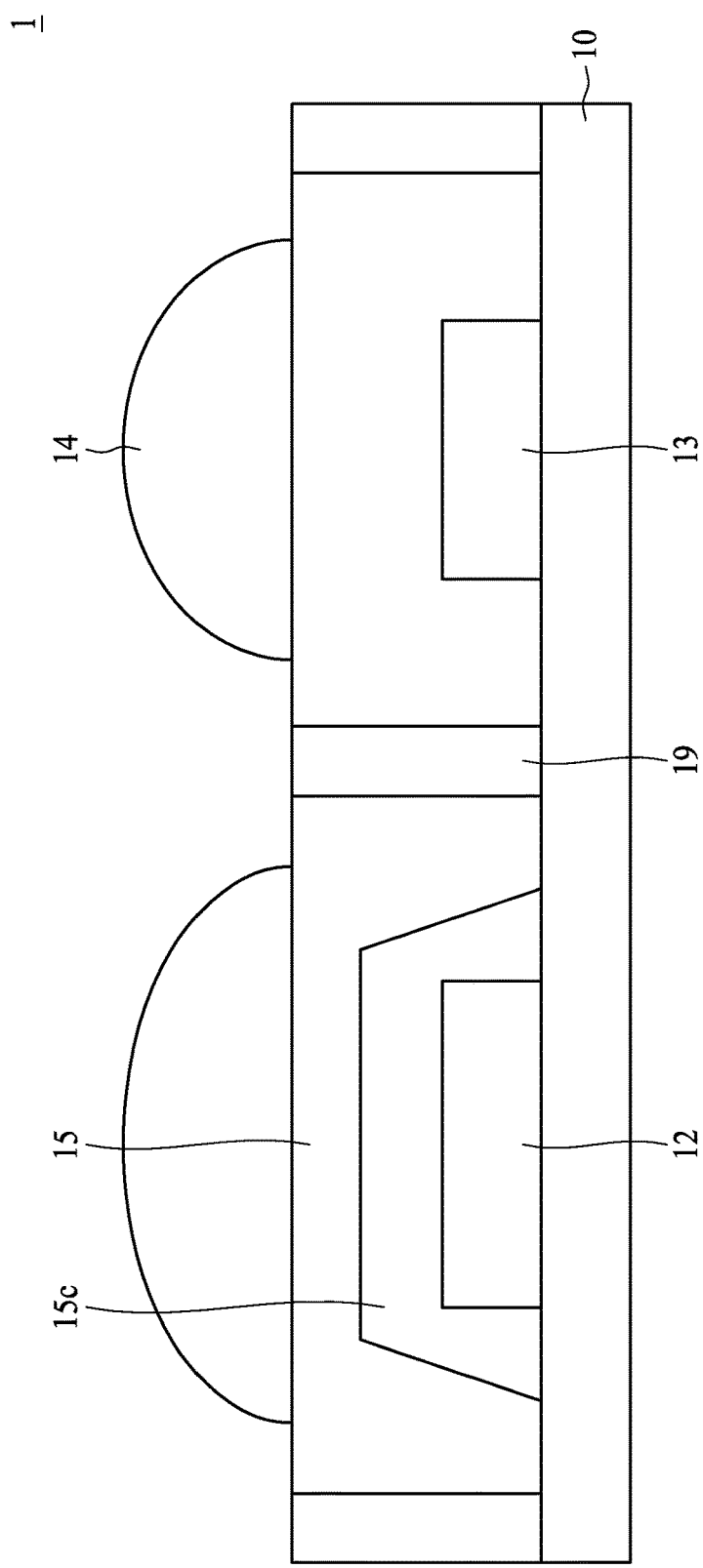
FIG. 1A, FIG. 1B and FIG. 1C illustrate a cross-sectional view of a semiconductor package device in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

FIG. 1A illustrates a cross-sectional view of a semiconductor package device 1 in accordance with some embodiments of the present disclosure. The semiconductor package device 1 includes a carrier 10, a first electronic component 12, a second electronic component 13, a first package body 15, a second package body 14, and a wall structure 19.

The carrier 10 may be, for example, a printed circuit board, such as a paper-based copper foil laminate, a composite copper foil laminate, or a polymer-impregnated glass-fiber-based copper foil laminate. The carrier 10 may include an interconnection structure, such as a plurality of conductive traces or a through via. In an embodiment, the carrier 10 includes ceramic material or a metal plate. In some embodiments, the carrier 10 may be a substrate, an organic substrate or a leadframe. In some embodiment, the carrier 10 may be a two-layer substrate which includes a core layer and a conductive material and/or structure disposed on an upper surface and a bottom surface of the carrier 10. The conductive material and/or structure may include a plurality of traces.

The first electronic component 12 is disposed on the carrier 10. The first electronic component 12 may be an emitting die or other optical die. For example, the first electronic component 12 may include a light-emitting diode, a laser diode, or another device that may include one or more semiconductor layers. The semiconductor layers may include silicon, silicon carbide, gallium nitride, or any other semiconductor materials. The first electronic component 12 can be connected to the carrier 10 by way of flip-chip or wire-bond techniques, for example. In some embodiments, a LED die is bonded on the carrier 10 via a die bonding material. The LED die includes at least one wire-bonding pad. The LED die is electrically connected to the carrier 10 by a conductive wire, one end of which is bonded to the wire-bonding pad of the LED die and another end of which is bonded to a wire-bonding pad of the carrier 10.

The second electronic component 13 is disposed on the carrier 10. The second electronic component 13 may be an emitter or optical die. For example, the second electronic component 13 may include a light-emitting diode, a laser diode, or another device that may include one or more semiconductor layers. The semiconductor layers may include silicon, silicon carbide, gallium nitride, or any other semiconductor materials. In some embodiments, the second electronic component 13 is substantially the same as the first electronic component 12. Alternatively, the second electronic component 13 is different than the first electronic component 12. The second electronic component 13 can be connected to the carrier 10 by way of flip-chip or wire-bond techniques.

The first package body 15 is disposed on the carrier 10 such that it covers the first electronic component 12 and leaves an air gap 15c between the first electronic component 12 and the first package body 15. In some other embodiments, a gap other than an air gap (such as, for example, a vacuum or a gap filled with some substance or material other than air) is used instead of, or in combination with, the air gap 15c. In some embodiments, the first package body 15 includes an epoxy resin. In some embodiments, the first package body 15 is a lens.

The second package body 14 is disposed on the carrier 10 such that it substantially covers the second electronic component 13 (e.g. completely covers the second electronic component 13). The second package body 14 is solid and there is substantially no gap between the second package body 14 and the second electronic component 13 (e.g. the second packaging body 14 and/or the carrier 10 are in contact with substantially all of an outer surface of the second electronic component 13). In some embodiments, the second package body 14 includes an epoxy resin. In some embodiments, the second package body 14 and the first package body 15 include a same material. In some embodiments, the second package body 14 and the first package body 15 include different materials.

The wall structure 19 is disposed on the carrier 10 between the first electronic component 12 and the second electronic component 13. The wall structure 19 is opaque to help prevent the light emitted by the first electronic component 11 and the second electronic component from interfering with each other.

Figure 1B:
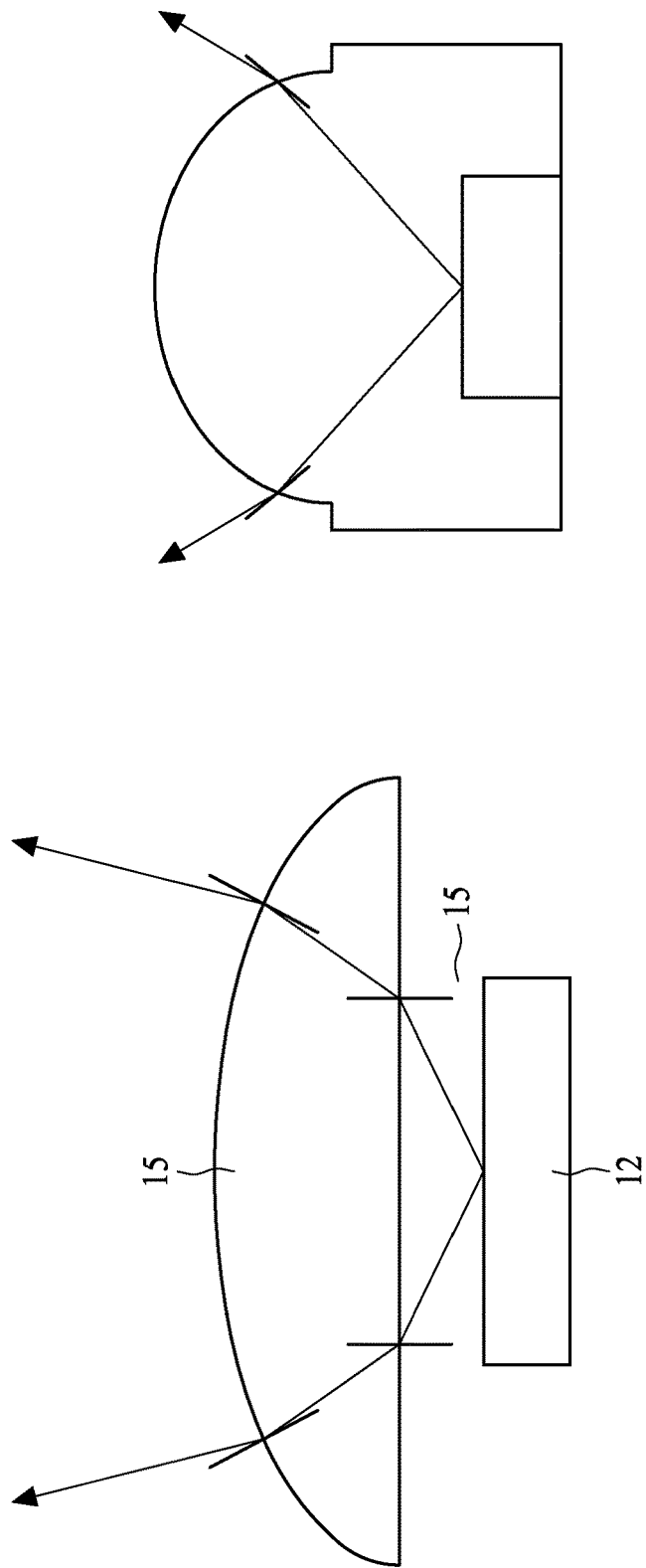

FIG. 1B illustrates a cross-sectional view of a semiconductor package device in accordance with some embodiments of the present disclosure. The example semiconductor package device illustrated on the left in FIG. 1B can provide for improved light emission intensity (e.g., improved light emission intensity for the first electronic component 12 shown in FIG. 1A), by collimation due to the structure of the package. The semiconductor package device illustrated on the left figure in FIG. 1B diagrammatically illustrates two surface interactions that cause refraction of light emitted by the first electronic component 12. A first surface interaction is between air and a lens, and a second surface interaction is between the lens and air. That is, the light emitted from the first electronic component 12 is refracted at least twice. For example, the first refraction occurs when the light passes the interface between air gap 15c and the first package body 15, and the second refraction occurs when the light passes the interface between the first package body 15 and air external to the first package body 15. Therefore, in comparison with light emitted through a lens molded around the light emitting component (e.g. a light emitted from a package that does not include an air gap, as shown in on the right in FIG. 1B), the light emitted from the first electronic component 12 through the first package body 15 may have improved light central intensity.

Figure 1C:
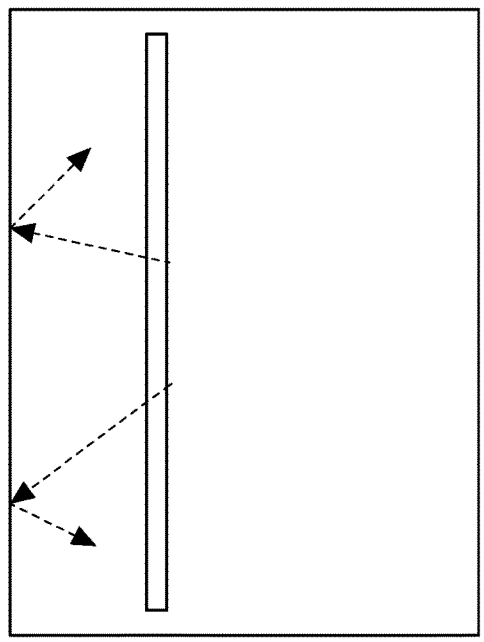
Figure 1C:
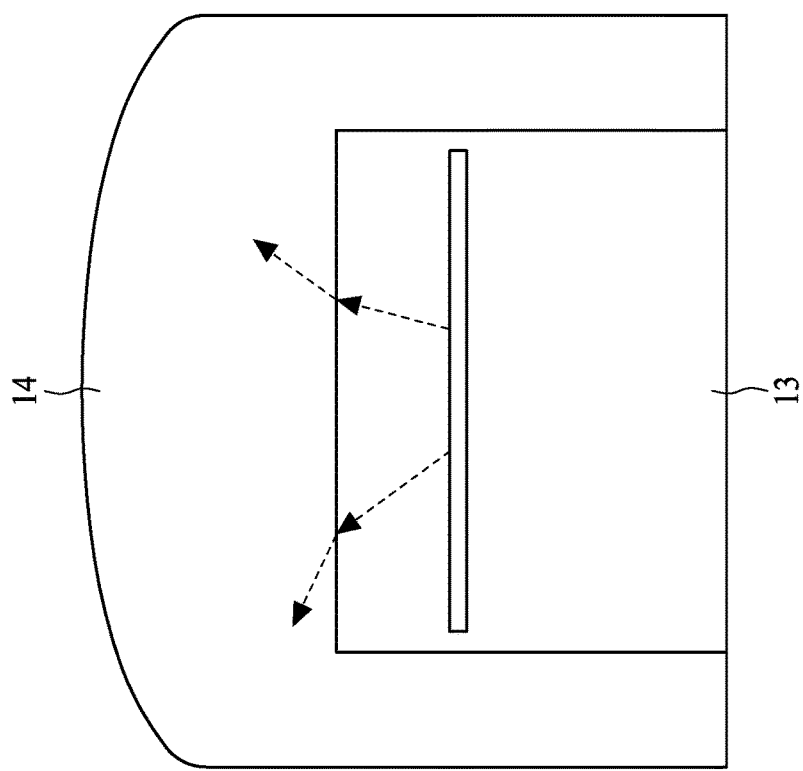

FIG. 1C illustrates a cross-sectional view of a semiconductor package device in accordance with some embodiments of the present disclosure. The example semiconductor package device illustrated on the left figure in FIG. 1C can provide for improved light emission efficiency (e.g., improved light emission efficiency for the second electronic component 13 shown in FIG. 1A). The second package body 14 can be an encapsulant disposed around the second electronic component 13. In some embodiments, the encapsulant is a molding compound. In some embodiments, the encapsulant is transparent in a frequency range of interest. For example, if the encapsulant is used around a light component which emits light within a red (or infrared) color frequency band, then the encapsulant may be transparent over a frequency range encompassing the red (or infrared) color frequency band. By encapsulating the second electronic component 13 with, for example, a molding compound, power loss due to light reflected at an air interface (e.g. as shown on the right in FIG. 1C) is avoided.

FIG. 2 illustrates an exploded perspective view of a semiconductor package device 2 in accordance with some embodiments of the present disclosure. The semiconductor package device 2 includes a first carrier 20, a second carrier 21, a first electronic component 22, a second electronic component 23, a first package body 25 and a second package body 24.

The first carrier 20 may be, for example, a printed circuit board, such as a paper-based copper foil laminate, a composite copper foil laminate, or a polymer-impregnated glass-fiber-based copper foil laminate. The first carrier 20 may include an interconnection structure, such as a plurality of conductive traces or a through via. In an embodiment, the first carrier 20 is includes a ceramic material or a metal plate. In some embodiments, the carrier 20 may include a substrate, an organic substrate or a leadframe. In some embodiment, the first carrier 20 may be a two layer substrate which includes a core layer and a conductive material and/or structure disposed on an upper surface and a bottom surface of the carrier 20. The conductive material and/or structure may include a plurality of traces.

The first electronic component 22 is disposed on the first carrier 20. The first electronic component 22 may be an emitting die or other optical die. For example, the first electronic component 22 may include a light-emitting diode, a laser diode, or another device that may include one or more semiconductor layers. The semiconductor layers may include silicon, silicon carbide, gallium nitride, or any other semiconductor materials. The first electronic component 22 can be connected to the first carrier 20 by way of flip-chip or wire-bond techniques, for example. In an embodiment, a LED die is bonded on the first carrier 20 via a die bonding material. The LED die includes at least one wire-bonding pad. The LED die is electrically connected to the first carrier 20 by a conductive wire, one end of which is bonded to the wire-bonding pad of the LED die and another end of which is bonded to a wire-bonding pad of the first carrier 20.

The second carrier 21 is disposed on the first carrier 20. In some embodiments, the second carrier 21 is attached to the first carrier 20 via a non-conductive adhesive 26n. In some embodiments, the second carrier 21 is substantially the same as the first carrier 20. Alternatively, the second carrier 21 is different than the first carrier 20.

The second carrier 21 defines an opening 21h or an aperture adjacent to the first electronic component 22. The opening 21h may expose at least a top of the first electronic component 22. In an embodiment, the carrier 21 is a 2-layer substrate. The opening 21h may be defined by a portion of a substrate core layer of the carrier 21. The core layer may be a bismaleimide-triazine resin (BT) core or an FR-4 grade core, for example. The opening 21h may be formed by a routing process or punch process. Thus, the first electronic component 22 is exposed from the second carrier 21, when the second carrier 21 is attached to the first carrier 20. The second carrier 21 includes a dam structure 21b on its bottom surface (shown in more detail in FIG. 2B). The dam structure may include, for example, a continuous protrusion from the bottom surface. The dam structure may surround the opening 21h. The dam structure 21b can help to prevent molding bleeding.

The second electronic component 23 is disposed on the second carrier 21. The second electronic component 23 may be an emitter or optical die. For example, the second electronic component 23 may include a light-emitting diode, a laser diode, or another device that may include one or more semiconductor layers. The semiconductor layers may include silicon, silicon carbide, gallium nitride, or any other semiconductor materials. In some embodiments, the second electronic component 23 is substantially the same as the first electronic component 22. Alternatively, the second electronic component 23 is different than the first electronic component 22. The second electronic component 23 can be connected to the second carrier 21 by way of flip-chip or wire-bond techniques, for example.

The first package body 25 has, or defines, a cavity 25c and is disposed on or in the opening 21h of the second carrier 21. In some embodiments, the first package body 25 includes an epoxy resin. In some embodiments, the first package body 25 is a lens. At least a portion of the first package body 25 is disposed in the opening 21h. There is a space or gap between the first electronic component 22 and the first package body 25. In some embodiments, the space is filled with air. With this configuration, light emitted from the first electronic component 22 may be refracted at least twice. The first refraction occurs when the light passes the interface between air within the cavity 25c and the first package body 25. The second refraction occurs when the light passes the interface between the first package body 25 and air external to the first package body 25. Therefore, in comparison with light emitted through a lens molded around the light emitting component without an air gap, the light emitted from the first electronic component 22 through the first package body 25 can have improved light central intensity.

The second package body 24 is disposed on the second carrier 21 and covers the second electronic component 23. The second package body 24 is solid, and there is substantially no space or gap between the second package body 24 and the second electronic component 23 (e.g. the second packaging body 24 and/or the carrier 21 are in contact with substantially all of an outer surface of the second electronic component 23). In some embodiments, the second package body 24 includes an epoxy resin. In some embodiments, the second package body 24 and the first package body 25 include a same material. In some embodiments, the second package body 24 and the first package body 25 include different materials. The refractive index of the second package body 24 may be greater than that of the air (air having the property n (refractive index)=1), and thus prevent power loss due to light reflected at an air interface (e.g. due to total reflection). Thus, some power loss may be avoided by encapsulating the second electronic component 23 without an air cavity in the encapsulant. Therefore, the light emitted from the second electronic component 23 through the second package body 24 could have higher power than light emitted otherwise.

Figure 2A:
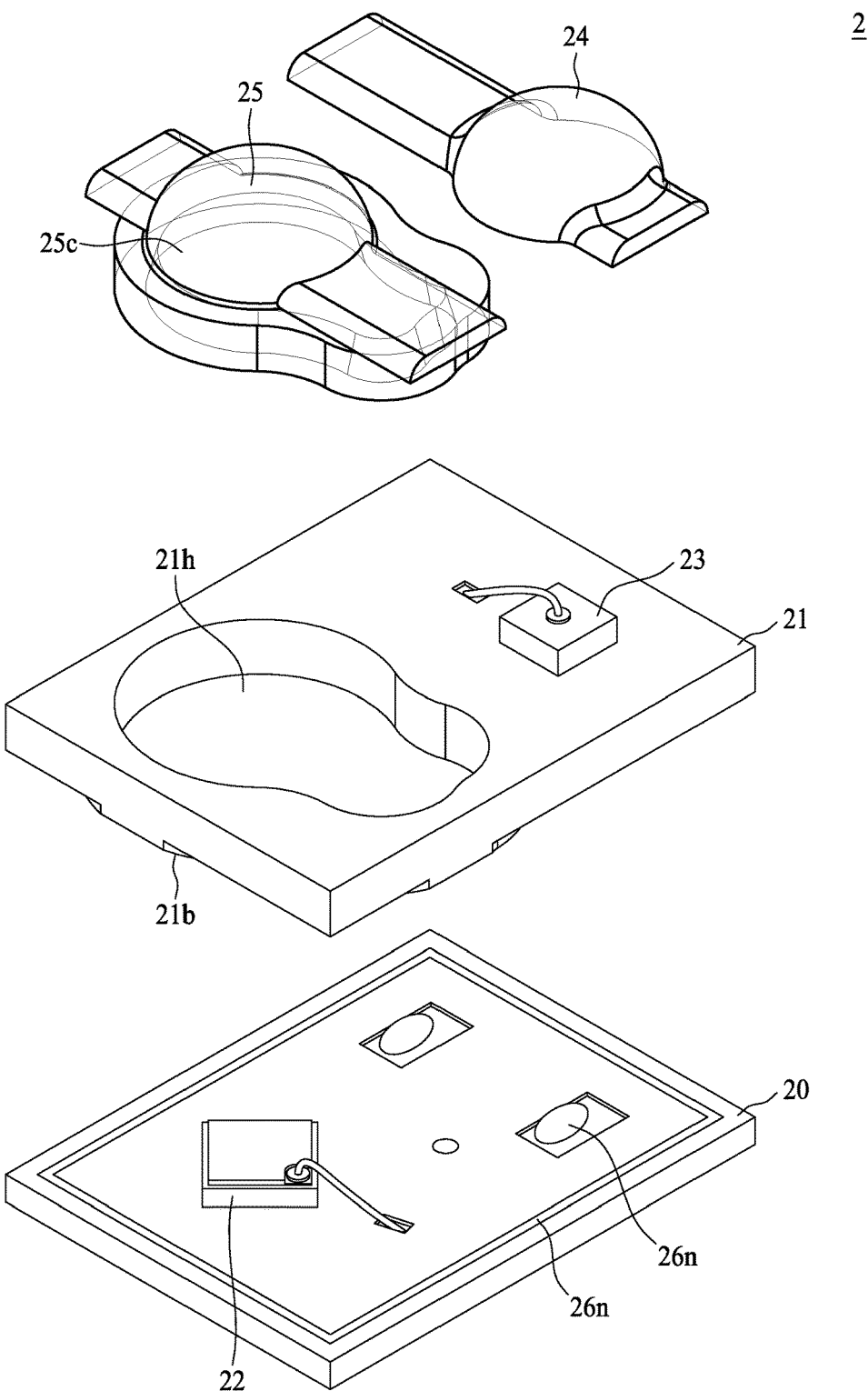
FIG. 2A illustrates an exploded perspective view of a semiconductor package device in accordance with some embodiments of the present disclosure.
Figure 2B:
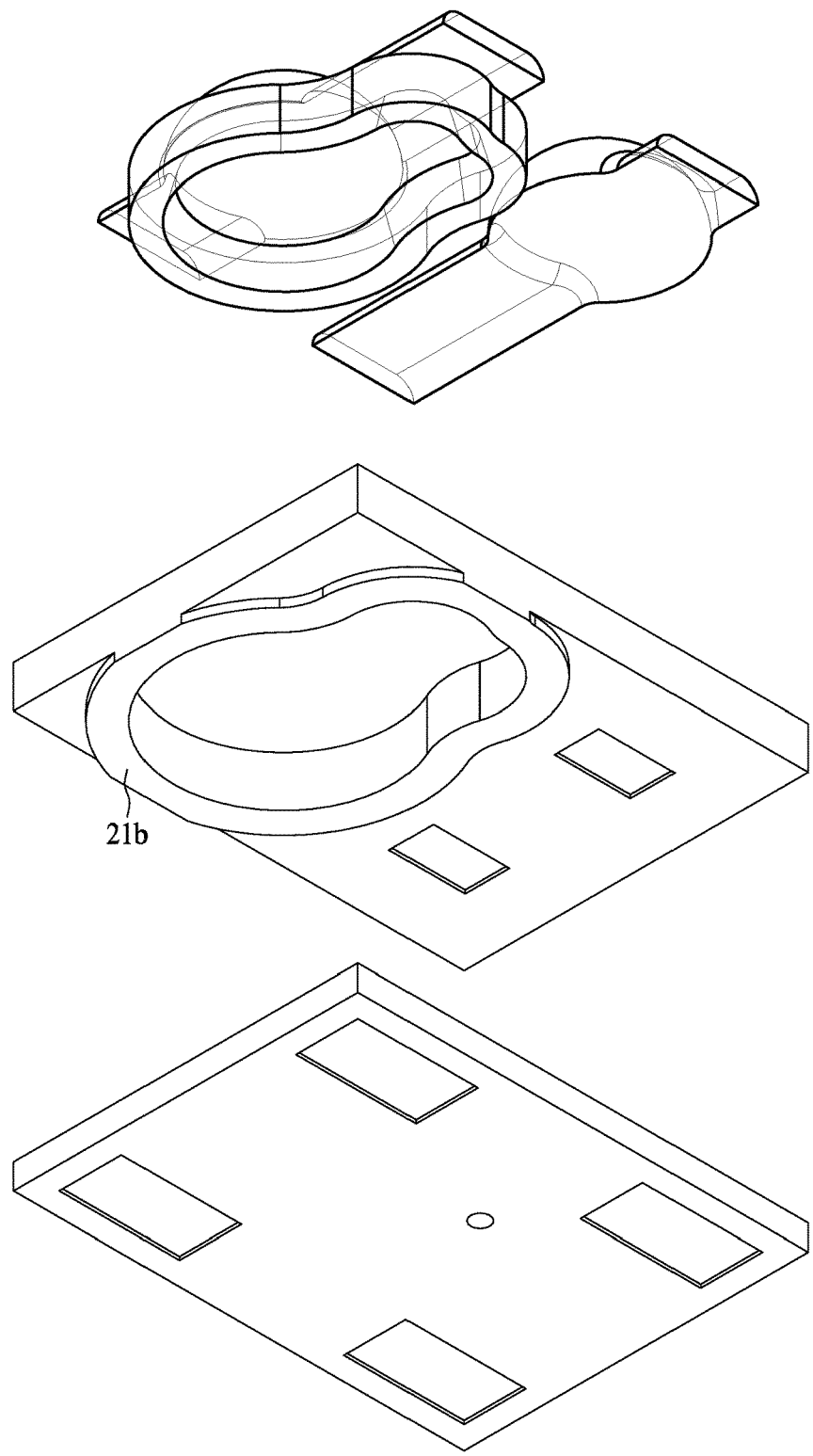
FIG. 2B illustrates a bottom view of a semiconductor package device in accordance with some embodiments of the present disclosure.

In some semiconductor package devices, different types of LEDs or LEDs having different emission characteristics are disposed within different packages, which might increase a total size of the packages or devices in which the packages are incorporated, and might increase the complexity of a connection wire arrangement. As shown in FIG. 2A, an LED with high central intensity and an LED with high power can be integrated within a same package, which can miniaturize a size of the semiconductor package device 2 and simplify a manufacturing process.

Figure 2C:
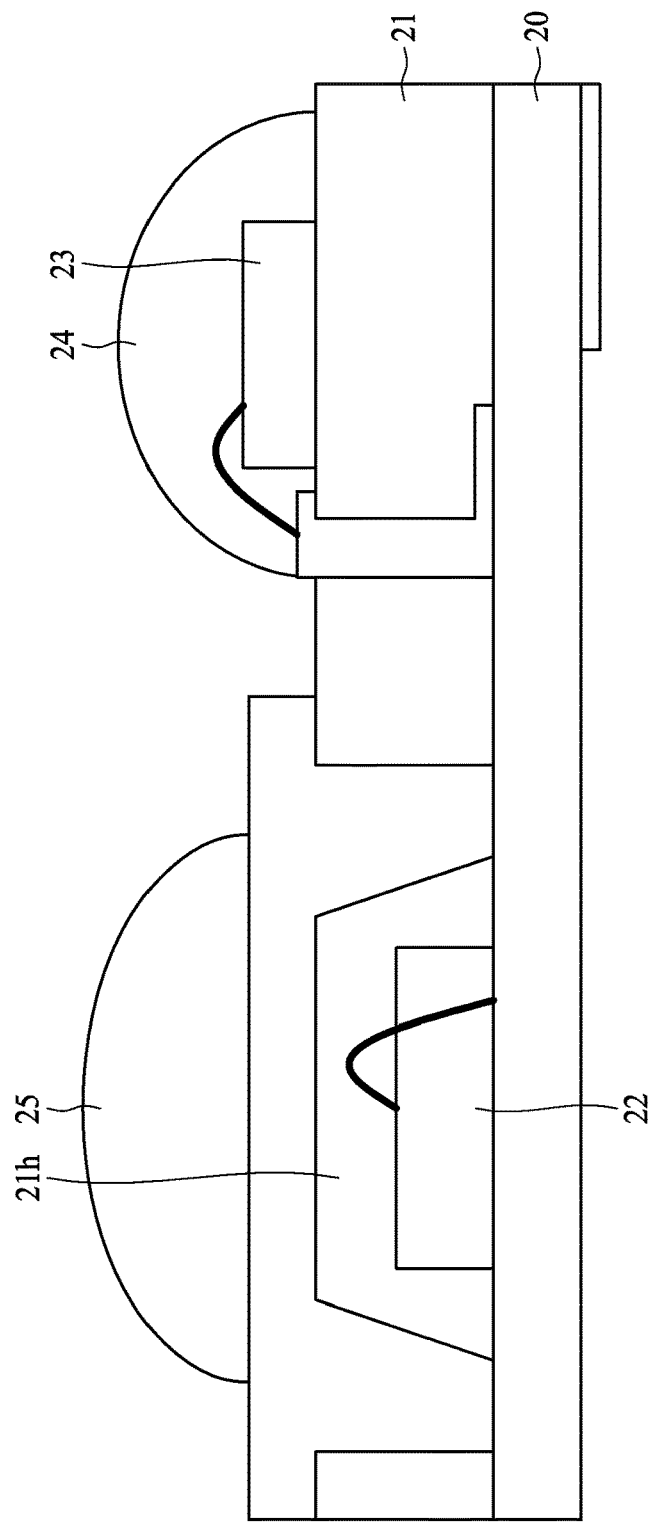
FIG. 2C illustrates a cross-sectional view of a semiconductor package device in accordance with some embodiments of the present disclosure.

FIG. 2C illustrates a cross-sectional view of the semiconductor package device 2 in accordance with some embodiments of the present disclosure.

As shown in FIG. 2C, the first package body 25 is disposed over the first electronic component 22 and leaves an air gap 21h between the first electronic component 22 and the first package body 25. The first electronic component 22 emits light in to the air gap, towards the first package body 25. As explained above in reference to FIG. 1B, with such a configuration light emitted from the first electronic component 22 would be refracted at least twice. For example, the first refraction would occur when the light passes the interface between air gap 21h and the first package body 25, and the second refraction would occur when the light passes the interface between the first package body 25 and air external to the first package body 25. Therefore, the light emitted from the first electronic component 22 through the first package body 25 would have improved light central intensity.

The second package body 24 can serve as an encapsulant around the second electronic component 23. In some embodiments, the encapsulant is a molding compound. In some embodiments, the encapsulant is transparent in a frequency range of interest. For example, if the encapsulant is used around a light component which emits light within a red (or infrared) color frequency band, then the encapsulant may be transparent over a frequency range encompassing the red (or infrared) color frequency band. By completely encapsulating the second electronic component 23 (e.g. without any air gaps), power loss due to light reflected at an air interface is avoided.

Figure 2D:
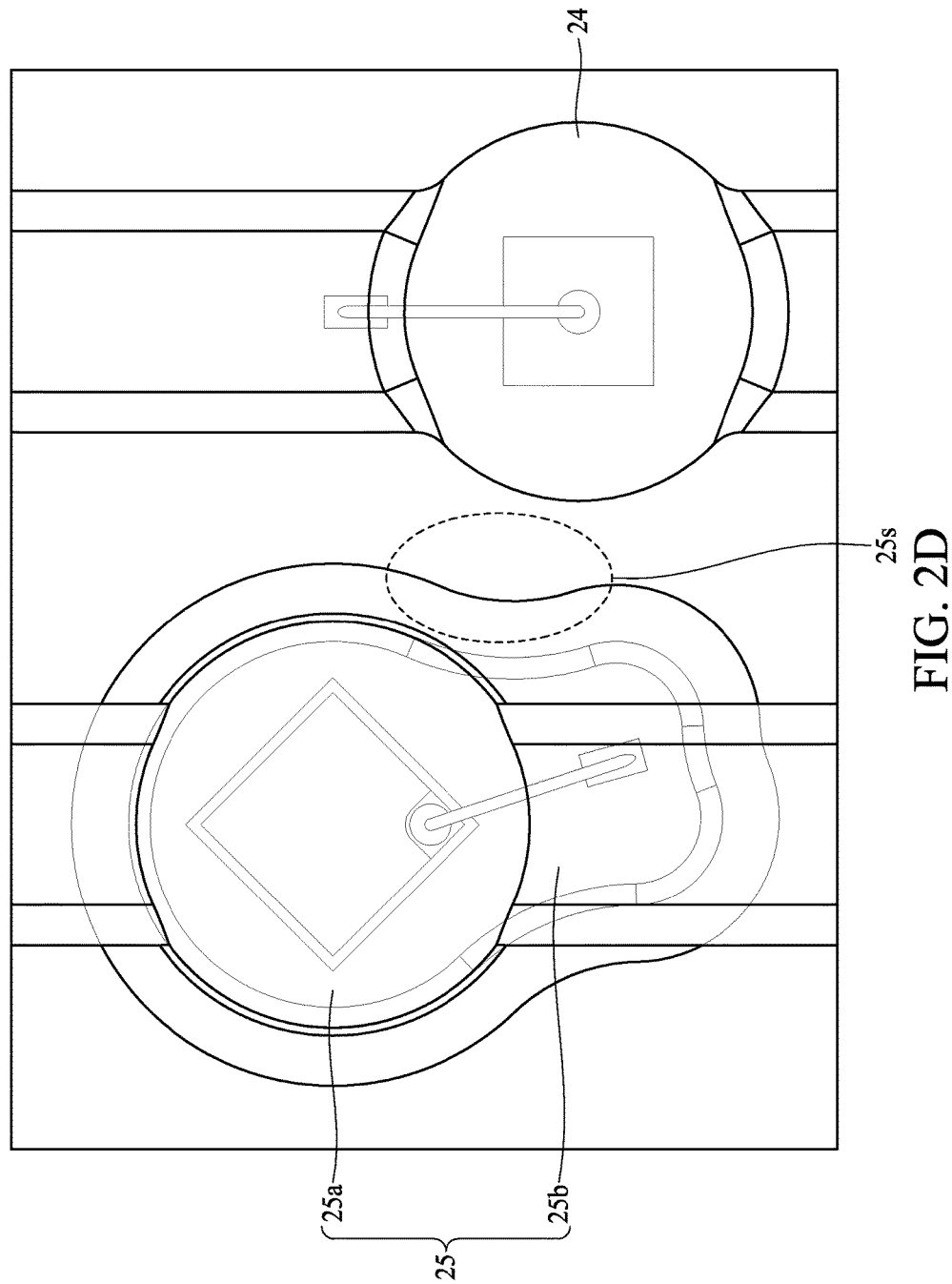
FIG. 2D illustrates a bottom view of a semiconductor package device in accordance with some embodiments of the present disclosure.

FIG. 2D illustrates a top view of the semiconductor package device 2 according to some embodiments of the present disclosure.

As shown in FIG. 2D, the first package body 25 has an inward curved portion 25s (e.g. a wall or side of the first package body 25 which curves inwards or in a concave manner) and the second package body 24 is disposed adjacent to the inward shrinkage portion 25s, which could reduce the layout area of the semiconductor package device 2 (e.g. an outward curved portion of the second package body 24, such as a wall or side of the second package body 24 which curves outwards or in a convex manner may be disposed adjacent to the inward curved portion 25s). The first package body 25 may include a first portion 25a for accommodating the first electronic component (which may be, for example, substantially in a circle or oval shape) and a second portion 25b for accommodating bonding wires of the first electronic component.

Figure 3:
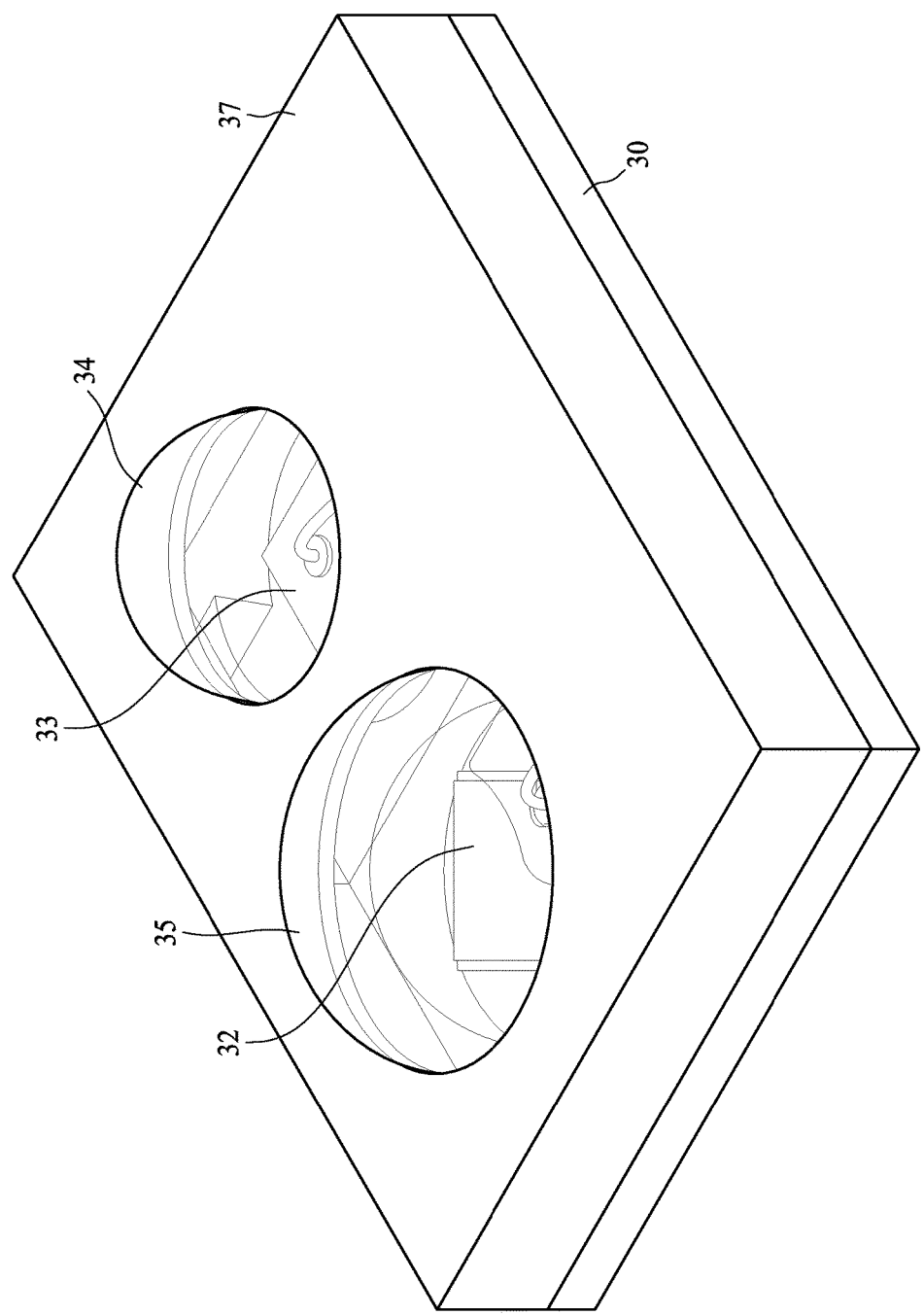
FIG. 3 illustrates a perspective view of a semiconductor package device in accordance with some embodiments of the present disclosure.

FIG. 3 illustrates a perspective view of a semiconductor package device 3 in accordance with some embodiments of the present disclosure. The semiconductor package device 3 includes a carrier 30, a first electronic component 32, a second electronic component 33, a first package body 35, a second package body 34 and a third package body 37.

The carrier 30 may be, for example, a printed circuit board, such as a paper-based copper foil laminate, a composite copper foil laminate, or a polymer-impregnated glass-fiber-based copper foil laminate. The carrier 30 may include an interconnection structure, such as a plurality of conductive traces or a through via. In an embodiment, the carrier 30 includes a ceramic material or a metal plate. In some embodiments, the carrier 30 may include a substrate, an organic substrate or a leadframe. In some embodiment, the carrier 30 may be a two-layer substrate which includes a core layer and a conductive material and/or structure disposed on an upper surface and a bottom surface of the carrier 30. The conductive material and/or structure may include a plurality of traces.

The first electronic component 32 is disposed on the carrier 30. The first electronic component 32 may be an emitting die or other optical die. For example, the first electronic component 32 may include a light-emitting diode, a laser diode, or another device that may include one or more semiconductor layers. The semiconductor layers may include silicon, silicon carbide, gallium nitride, or any other semiconductor materials. The first electronic component 32 can be connected to the carrier 10 by way of flip-chip or wire-bond techniques, for example. In some embodiments, a LED die is bonded on the carrier 30 via a die bonding material. The LED die has at least one wire-bonding pad. The LED die is electrically connected to the carrier 30 by a conductive wire, one end of which is bonded to the wire-bonding pad of the LED die and another end of which is bonded to a wire-bonding pad of the carrier 30.

The second electronic component 33 is disposed on the carrier 30. The second electronic component 33 may be an emitter or optical die. For example, the second electronic component 33 may include a light-emitting diode, a laser diode, or another device that may include one or more semiconductor layers. The semiconductor layers may include silicon, silicon carbide, gallium nitride, or any other semiconductor materials. In some embodiments, the second electronic component 33 is substantially the same as the first electronic component 32.

Alternatively, the second electronic component 33 is different than the first electronic component 32. The second electronic component 33 can be connected to the carrier 30 by way of flip-chip or wire-bond techniques, for example.

The first package body 35 is disposed on the carrier 30 and covers the first electronic component 32 such that it leaves an air gap between the first electronic component 32 and the first package body 35. In some embodiments, the first package body 35 includes an epoxy resin. In some embodiments, the first package body 35 is a lens.

The second package body 34 is disposed on the carrier 30 and substantially covers the second electronic component 33 (e.g. completely covers the second electronic component 33). The second package body 34 is solid and thus there is no space between the second package body 34 and the second electronic component 33. In some embodiments, the second package body 34 includes an epoxy resin. In some embodiments, the second package body 34 and the first package body 35 include a same material. In some embodiments, the second package body 34 and the first package body 35 include different materials.

The third package body 37 is disposed on the carrier 30 and covers the carrier 30, a portion of the first package body 35 and a portion of the second package body 34. As shown in FIG. 3, the top portion of the first package body 35 and the top portion of the second package body 34 are exposed from the third package body 37, and may protrude from the third package boy 37. In some embodiments, the third package body 37 includes an epoxy resin. In some embodiments, the third package body 37, the first package body 35 and the second package body 34 include a same material. In some embodiments, the third package body 37, the first package body 35 and the second package body 34 include different materials.

Figure 4:
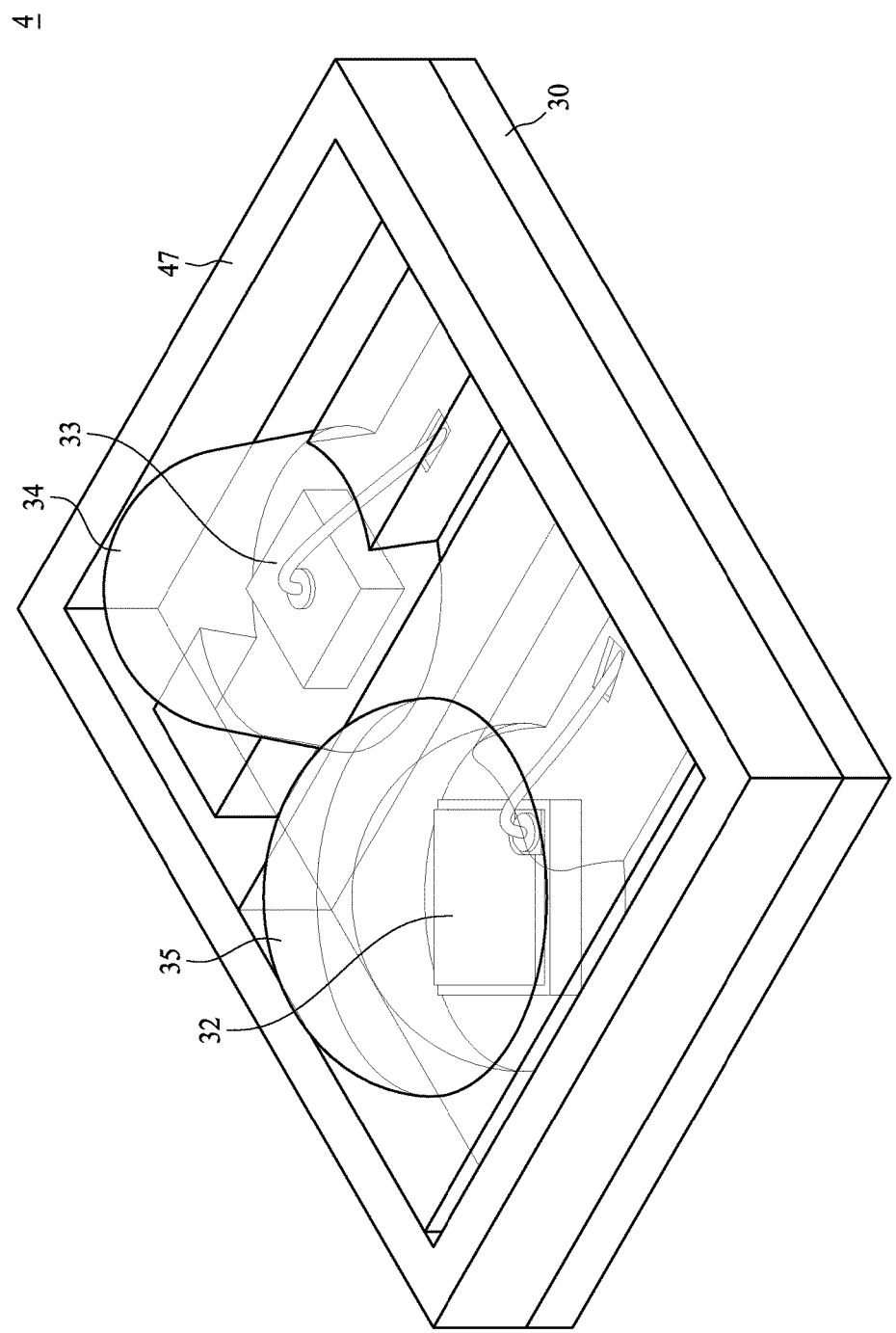
FIG. 4 illustrates a perspective view of a semiconductor package device in accordance with some embodiments of the present disclosure.

FIG. 4 illustrates a perspective view of a semiconductor package device 4 in accordance with some embodiments of the present disclosure. The semiconductor package device 4 is similar to the semiconductor package device 3 depicted in FIG. 3, except a portion of the first package body 35 and a portion of the second package body 34 are surrounded by a lid 47 rather than covered by a third package body 37.

The lid 47 is disposed on the carrier 30 and around the edges of the carrier 30. The lid 47 surrounds the first package body 35 and the second package body 34. In some embodiments, the lid 47 includes plastic.

Figure 5A:
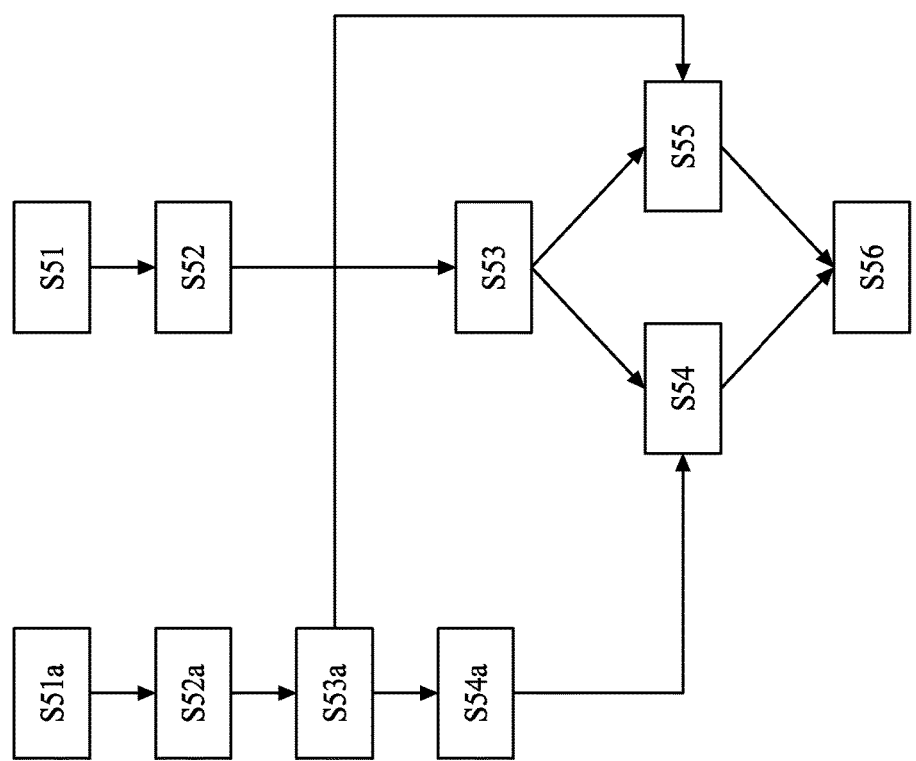
FIG. 5A and FIG. 5B illustrate a flow chart for manufacturing a semiconductor package device in accordance with some embodiments of the present disclosure.

FIG. 5A illustrates a flow chart for manufacturing a semiconductor package device 2 shown in FIG. 2A in accordance with some embodiments of the present disclosure. Although some processes, operations or steps are described in the following with respect to each of a plurality of components, any of those processes, operations or steps may be performed with respect to only one of the plurality of components, or with respect to some number in between one and the full plurality of components.

Referring to the operation S51, a first carrier strip including multiple first carriers 20 is provided. Provision of the multiple first carriers 20 can allow multiple semiconductor package devices to be manufactured concurrently. A respective first electronic component 22 is respectively connected to each of the first carriers 20 by, for example, flip-chip or wire-bond techniques.

Referring to the operation S52, a non-conductive adhesive 16n is applied on each of the first carriers 20. In some embodiments, the non-conductive adhesive 16n is applied along the edges of each of the first carriers 20.

Referring to the operation S53, a conductive adhesive 26c is applied on each of the first carriers 20. The conductive adhesive 26c can be used to provide electrical connections between the first electronic components 22 disposed on the first carriers 20 and second electronic components 23 disposed on second carriers 21.

Referring to the operation S51a, a second carrier strip including multiple second carriers 21 is provided. Provision of the multiple second carriers 21 can allow multiple semiconductor package devices to be manufactured concurrently. A respective opening 21h is formed in each second carrier 21 and penetrates each second carrier 21. In some embodiments, the opening 21h can be formed by drilling, etching or other suitable processes.

Referring to the operation S52a, each of a plurality of second electronic components 23 is respectively connected to each of the second carriers 21 by, for example, flip-chip or wire-bond techniques.

Referring to the operation S53a, a respective first package body 25 which includes or defines a cavity or air gap 25c is respectively formed on each of the second carriers 21 and covers the respective opening 21h, and a respective second package body 24 is respectively formed without a cavity or air gap on each of the second carriers 21 and covers the respective second electronic component 23.

In some embodiments, the operation S54a is performed, which includes a singulation process performed through the second carrier strip which includes the second carriers 21. The singulation process may be performed, for example, by using a dicing saw, laser or other appropriate cutting technique.

Figure 5B:
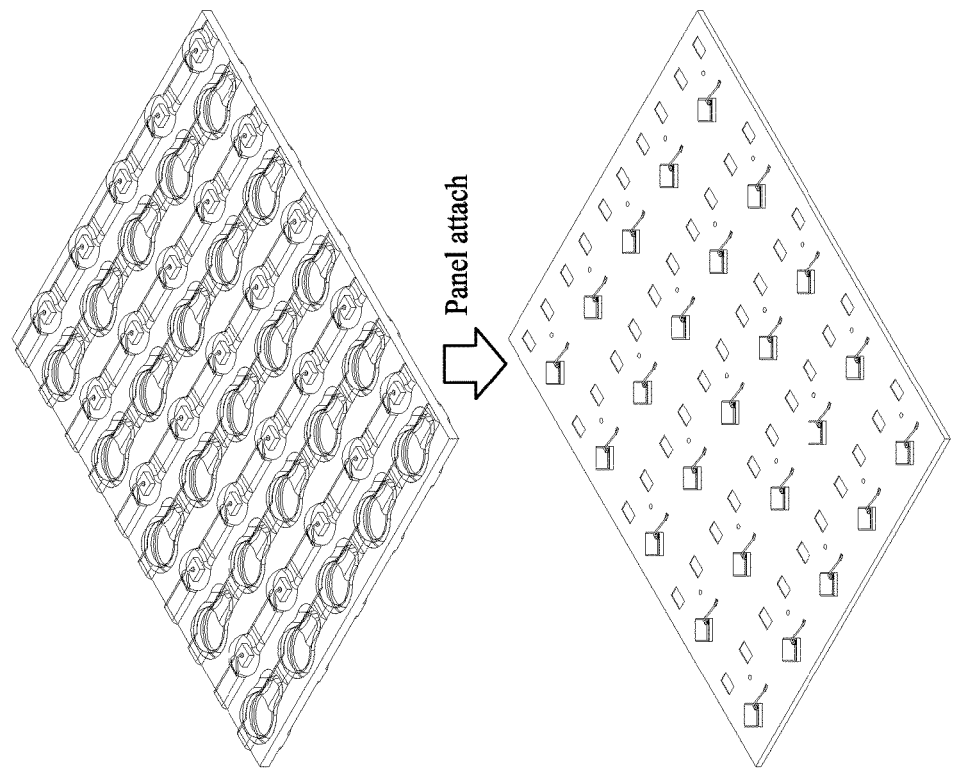
Figure 5B:
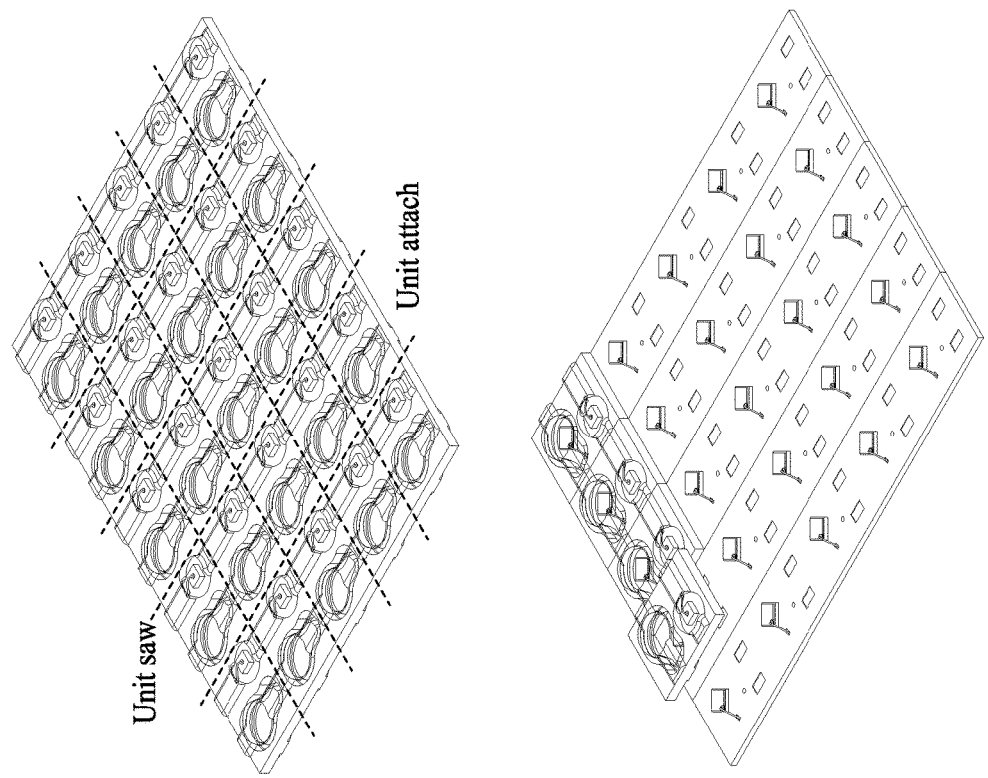

In the operation S54, each of the respective second carriers 21 are attached to the first carrier strip by, for example, use of a pick-and-place technique (as shown on the left in FIG. 5B). In some embodiments, the second carriers 21 are fastened to the first carrier strip via the non-conductive adhesive 26n. The second carriers 21 are arranged so that their respective openings 21h are over corresponding first electronic components 22 disposed on the first carrier 20. By using the pick-and-place technique to attach each individual second carrier 21 to the first carrier strip, control of the relative location of the second carrier and the first carrier can be more readily attained, which can help increase the precision and accuracy of the technique.

In other embodiments, the operation S55 is performed, in which the second carrier strip is attached to the first carrier strip without performing singulation, by, for example, a panel-to-panel attachment technique. In some embodiments, the second carrier strip is fastened to the first carrier strip via the non-conductive adhesive 26n. The second carrier strip is arranged such that the respective openings 21h of each of the second carriers 21 is over a corresponding first electronic component 22 disposed on the first carrier 20. Using the panel-to-panel attachment technique (as shown on the right in FIG. 5B) to attach the second carrier strip on the first carrier strip can help increase manufacturing throughput (e.g., high units per hour (UPH)).

Referring to the operation S56, a curing process is performed and then a singulation process is performed to separate out individual semiconductor package devices. If the second carrier strip was separated in the operation S54a, the singulation process is performed for the first carrier strip. If the second carrier strip was not separated and was attached to the first carrier strip by a panel-to-panel attachment technique (S55), the singulation process is performed for the first carrier strip and the second carrier strip. The singulation process may be performed, for example, by using a dicing saw, laser or other appropriate cutting technique.

Figure 6:
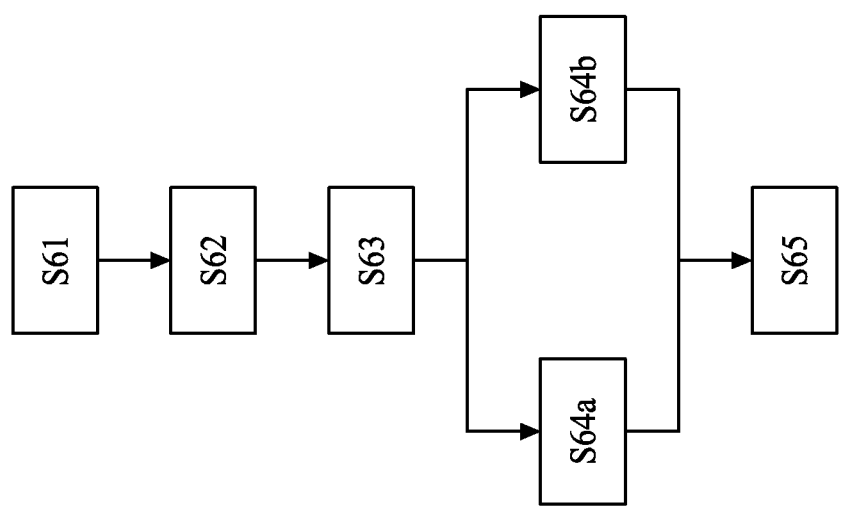
FIG. 6 illustrates a flow chart of manufacturing a semiconductor package device in accordance with some embodiments of the present disclosure.

FIG. 6 illustrates a flow chart for manufacturing semiconductor package devices 3 and 4 shown in FIGS. 3 and 4 in accordance with some embodiments of the present disclosure. Although some processes, operations or steps are described in the following with respect to each of a plurality of components, any of those processes, operations or steps may be performed with respect to only one of the plurality of components, or with respect to some number in between one and the full plurality of components.

Referring to the operation S61, a carrier strip including multiple carriers 30 is provided. Provision of the multiple carriers 30 allows multiple semiconductor package devices to be manufactured concurrently. A respective first electronic component 32 is respectively connected to each of the carriers 30 by, for example, flip-chip or wire-bond techniques. The second electronic component 33 is respectively connected to each of the carriers 30 by, for example, flip-chip or wire-bond techniques.

Referring to the operation S62, a respective first package body 35 which includes or defines a cavity is respectively formed on each carrier 30 and covers the corresponding first electronic component 32, and a second package body 34 without a cavity is respectively formed on each carrier 30 and covers the second electronic component 33.

Referring to the operation S63, a half cut process is performed to form trenches defined by the multiple carriers.

In some embodiments, the operation S64a is performed to form the semiconductor package device 3 shown in FIG. 3, in which a third package body 37 is respectively formed on each of the carriers 30, covering at least a portion of the carriers 30, a portion of the corresponding first package body 35 and a portion of the corresponding second package body 34.

In other embodiments, the operation S64b is performed to form the semiconductor package device 4 shown in FIG. 4, in which a lid 47 is respectively formed on each of the carriers 30 and around the respective edges of the carriers 30. The lid 47 surrounds the corresponding first package body 35 and the corresponding second package body 34.

Referring to the operation S65, a curing process is performed and then a singulation process is performed to separate out individual semiconductor package devices. For example, the singulation is performed through the carrier strip including the carriers 30. The singulation process may be performed, for example, by using a dicing saw, laser or other appropriate cutting technique.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within μm of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°.

When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A electronic device, comprising:
  a first carrier;
  a first electronic component disposed on the first carrier;
  a second carrier defining an aperture and disposed on the first carrier, wherein the aperture is positioned over the first electronic component and exposes the first electronic component;
  a second electronic component disposed on the second carrier;
  an encapsulant covering the second electronic component;
  a lens defining a cavity and disposed on the aperture of the first second carrier.

2. The electronic device of claim 1, wherein at least a portion of the lens is disposed in the aperture.

3. The electronic device of claim 2, wherein the electronic device further comprises a dam disposed on the bottom surface of the second carrier.

4. The electronic device of claim 1, wherein there is a gap between the first electronic component and the lens structure.

5. The electronic device of claim 4, wherein the gap is at least partially filled with air.

6. The electronic device of claim 1, wherein the first electronic component and the second electronic component are light emitting devices.

7. The electronic device of claim 1, wherein the encapsulant and the lens comprise a same material.

8. A semiconductor package device comprising:
  a carrier;
  a first chip disposed on the carrier;
  a first package body encapsulating the first chip;
  a second package body defining a cavity and disposed on the carrier; and
  a second chip disposed within the cavity of the second package body.

9. The semiconductor package device of claim 8, wherein there is a gap between the second chip and the second package body.

10. The semiconductor package device of claim 9, wherein the gap is at least partially filled with air.

11. The semiconductor package device of claim 8, further comprising a third package body covering at least a portion of a top surface of the carrier, the first package body and the second package body.

12. The semiconductor package device of claim 8, further comprising a lid disposed around edges of the carrier.

13. The semiconductor package device of claim 8, further comprising a dam disposed on a bottom surface of the carrier adjacent to the cavity.

14. A semiconductor package device comprising:
  a first carrier;
  a first chip disposed over the first carrier;
  a second chip disposed over the first carrier and having an outer surface;
  a first package body encapsulating the first chip, wherein the first chip and the first package body define a gap; and
  a second package body encapsulating the second chip, wherein the second package body is in contact with substantially all of the outer surface of the second chip.

15. The semiconductor package device of claim 14, wherein the gap is at least partially filled with air.

16. The semiconductor package device of claim 14, further comprising a second carrier defining an aperture and disposed on the first carrier, wherein the aperture is positioned over the first chip and exposes the first chip.

17. The semiconductor package device of claim 16, wherein the first chip is directly disposed on the first carrier and the second chip is directly disposed on the second carrier.

18. The semiconductor package device of claim 16, wherein at least a portion of the first package body is disposed within the aperture.

19. The semiconductor package device of claim 14, further comprising a third package body covering at least a portion of a top surface of the first carrier, the first package body and the second package body.

20. The semiconductor package device of claim 14, further comprising a lid disposed around one or more edges of the first carrier.

* * * * *